(12) United States Patent
Kinoshita

(10) Patent No.: US 6,757,213 B2
(45) Date of Patent: Jun. 29, 2004

(54) SYNCHRONOUS DRAM CONTROLLER

(75) Inventor: Shuuetsu Kinoshita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 24 days.

(21) Appl. No.: 10/285,550

(22) Filed: Nov. 1, 2002

(65) Prior Publication Data

US 2003/0156488 A1 Aug. 21, 2003

(30) Foreign Application Priority Data

Feb. 18, 2002 (JP) .......................................... 2002-039525

(51) Int. Cl.[7] .................................................. G11C 8/00
(52) U.S. Cl. .................... 365/233; 365/189.01; 711/167
(58) Field of Search ............................ 365/189.01, 233; 711/154, 167, 168

(56) References Cited

U.S. PATENT DOCUMENTS

| | | | |
|---|---|---|---|
| 5,450,572 A | 9/1995 | Ruedinger et al. | 713/500 |
| 5,812,489 A | 9/1998 | Matsui | 365/233 |
| 5,828,871 A | 10/1998 | Kawaguchi et al. | 713/600 |
| 6,240,495 B1 * | 5/2001 | Usui | 711/167 |
| 6,556,483 B2 * | 4/2003 | Ryan et al. | 365/189.04 |

FOREIGN PATENT DOCUMENTS

| | | |
|---|---|---|
| JP | 05-189081 | 7/1993 |
| JP | 08-212778 | 8/1996 |
| JP | 8-221315 | 8/1996 |
| JP | 9-265777 | 10/1997 |

* cited by examiner

Primary Examiner—Son Mai
(74) Attorney, Agent, or Firm—Volentine Francos, PLLC

(57) ABSTRACT

In the synchronous DRAM controller of this invention, when receiving a read request to an SDRAM (Synchronous Dynamic Random Access Memory) from an internal bus, a control sequencer outputs a start readout signal that synchronizes with the system clock signal. A start readout operation unit, receiving the start readout signal from the control sequencer, starts transferring a readout clock signal to the SDRAM. A signal delay path receives the readout clock signal from the start readout operation unit, delays the signal to transfer it to the SDRAM, and further delays a part of the readout clock signal to transfer it to the control sequencer. A temporary read data retention unit receives and temporarily retains a read data outputted from the SDRAM at each cycle of the readout clock signal through the signal delay path. The control sequencer sends a read data storage enabling signal to the temporary read data retention unit, when receiving a part of the readout clock signal from the signal delay path, makes the temporary read data retention unit temporarily store the read data taken in to be synchronized with the readout clock signal, and at the same time outputs a read data readout enabling signal to the temporary read data retention unit so as to output the read data in synchronization with the system clock signal.

4 Claims, 4 Drawing Sheets

SYNCHRONOUS DRAM CONTROLLER

FIELD OF INVENTION

The present invention relates to a synchronous DRAM controller for synchronously controlling the readout operation of a DRAM (Dynamic Random Access Memory).

BACKGROUND OF THE INVENTION

A synchronous DRAM controller (hereinafter described as SDRAM controller) generates a readout clock signal (hereinafter described as SCLK) that controls the data readout operation of the synchronous DRAM (hereinafter described as SDRAM) from the system clock signal (hereinafter described as DCLK) which is a reference for its own control operation. This SCLK is delayed by Td1 in relation to the DCLK on the process of passing through the inside of the SDRAM controller and the printing wiring board on which the SDRAM controller is mounted. This delayed signal will be named as SCLK (1). The SCLK (1) is supplied to the SDRAM.

Further, the SDRAM controller, after receiving a read request from the internal bus, generates the address/data/control signal and supplies it to the SDRAM. When this occurs, the SDRAM takes in the read data only for one cycle of the SCLK (1) in synchronization with the SCLK (1). Along with this read data that has been taken in, the SDRAM outputs the SCLK (1). Thereafter, the read data is taken in at each cycle of this SCLK (1) and is outputted.

This read data is delayed by Td2 (Td1≈Td2) on the process of passing through the inside of the SDRAM controller and the printing wiring board on which the SDRAM controller is mounted. Similarly, the SCLK (1) outputted by the SDRAM is also delayed by Td2 (Td1≈Td2) on passing through the inside of the SDRAM controller and the printing wiring board on which the SDRAM is mounted. This signal will be named as SCLK (2). The read data is transferred to the SDRAM controller in synchronization with the SCLK (2). Further the clock conversion of SCLK (2) to DCLK is executed. The SDRAM controller, after transferring the read request to the SDRAM, sends a data signal to the internal bus, assuming that a predetermined read data has been received after a predetermined clock cycle.

However, the conventional technique had the following problem to be solved.

That is, the SCLK (2) is delayed by Td1+Td2 in relation to the DCLK as mentioned above. Therefore, there occurred a problem such that, when the SDRAM controller received the read data and SCLK (2) from the SDRAM, the read data that could have been determined to fall within a cycle of adjacent pulses of SCLK (2) could not be determined to fall within the cycle, just the moment the clock signal SCLK (2) was converted into DCLK.

In order to solve this situation, there was a need to shorten the delay time of SCLK (2) in relation to DCLK, or to extend the cycle of the clock signal. As a result, sophistication of the inner layout of an LSI in order to shorten the delay time, or lowering the frequency of DCLK in order to extend the cycle of the clock signal was required for the measure.

SUMMARY OF INVENTION

In the synchronous DRAM controller relating to the present invention, when receiving a read request to the SDRAM (Synchronous Dynamic Random Access Memory) from an internal bus, a control sequencer outputs a start readout signal that synchronizes with the system clock. A start readout operation unit starts transferring a readout clock signal to the SDRAM, when receiving the start readout signal from the control sequencer. A signal delay path receives the readout clock signal from the start readout operation unit, delays the signal to transfer it to the SDRAM, and further delays a part of the readout clock signal to transfer it to the control sequencer. A temporary read data retention unit receives and temporarily retains a read data outputted by the SDRAM at each cycle of the readout clock signal through the signal delay path. When receiving a part of the readout clock signal from the signal delay path, the control sequencer sends a read data storage enabling signal to the temporary read data retention unit, makes the temporary read data retention unit temporarily retain the read data taken in to be synchronized with the readout clock signal, and outputs a read data readout enabling signal in order to output the read data to synchronize with the system clock signal.

By realizing such configuration, a read data taken in from the SDRAM in accordance with each cycle of the readout clock signal, which is delayed by a predetermined time in the signal delay path, is temporarily stored in the temporary read data retention unit in accordance with a timing of the readout clock signal traveling through the same path, having a delay of the same period of time. In this manner, the read data has been retained accurately before the control sequencer sends the read data readout enabling signal synchronized with the system clock. Thus, it is possible to prevent indeterminacy of the read data taken in at each cycle of the readout clock signal.

BRIEF DESCRIPTION OF THE DRAWINGS

Preferred embodiments of the present invention will be described in detail based on the followings, wherein.

PREFERRED EMBODIMENT OF THE INVENTION

[Concrete Example 1]

Figure 1:
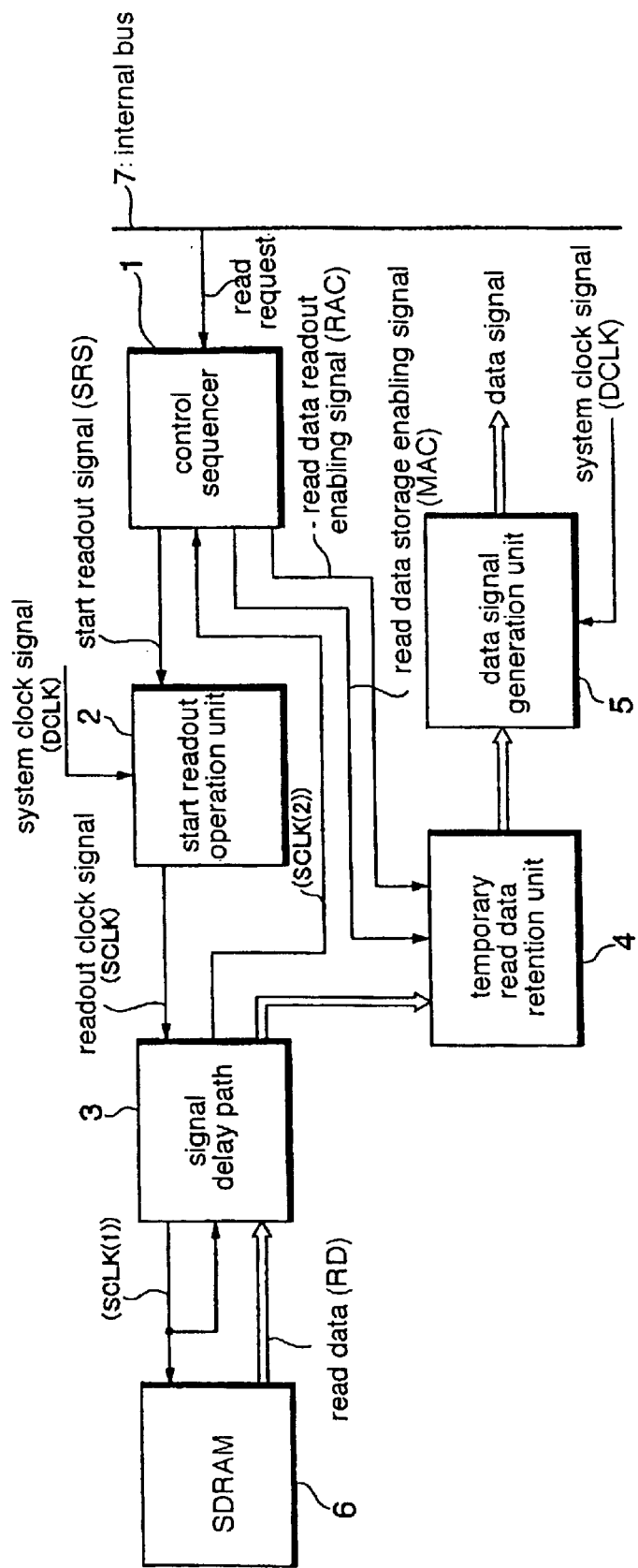
FIG. 1 is a block diagram illustrating the basic configuration relating to the present invention.

FIG. 1 illustrates a block diagram showing the basic configuration relating to the present invention. A synchronous DRAM controller according to the invention is provided with a control sequencer 1, a start readout operation unit 2, a signal delay path 3, a temporary read data retention unit 4, and a data signal generation unit 5.

Figure 2:
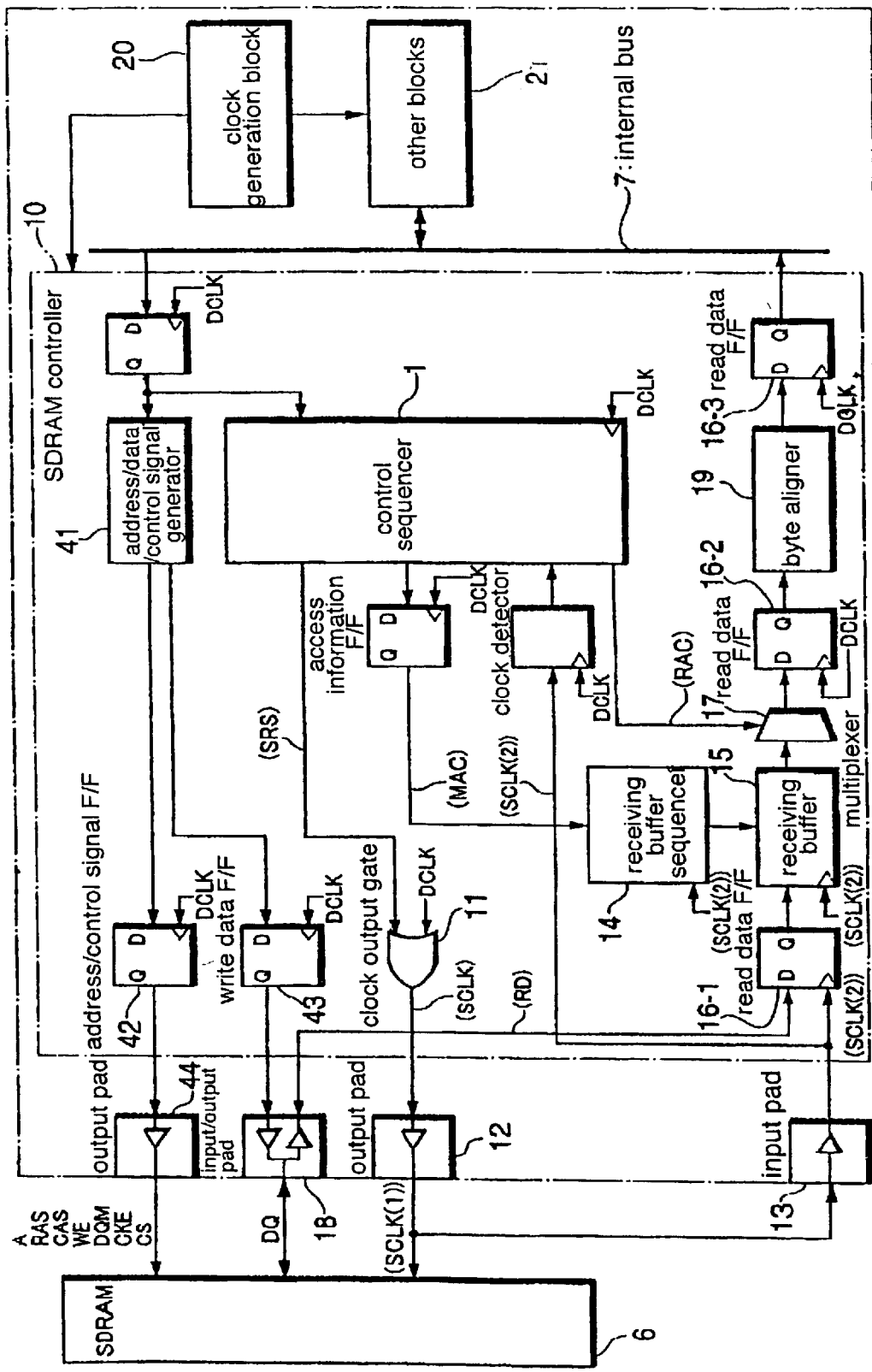
FIG. 2 is a circuit diagram relating to the invention.

FIG. 2 illustrates a circuit diagram relating to the invention. Here, the configuration relating to the invention will be explained based on FIG. 1 and FIG. 2.

The control sequencer 1 is a unit that outputs a start readout signal when receiving a read request from an internal bus 7. Also, the control sequencer 1 sends a read data storage enabling signal (MAC) to the temporary read data retention unit 4 when receiving a part of the readout clock signal (SCLK(2)) from the signal delay path 3, and makes the temporary read data retention unit 4 retain a read data (RD) in accordance with the timing of a readout.

Then, the control sequencer 1 outputs a read data readout enabling signal (RAC) to the temporary read data retention unit 4, and transfers the read data (RD) in accordance with the timing of the system clock signal (DCLK). The system clock signal (DCLK) is generated and supplied by a clock generation block 20 (FIG. 2).

The start readout operation unit 2, receiving a start readout signal (SRS) from the control sequencer 1, starts transferring the readout clock signal (SCLK). For example, a clock output gate 11 (FIG. 2) takes on this role. In other word, the control sequencer 1 (FIG. 2) outputs H (high-level) to one of the terminals of the clock output gate 11 (FIG. 2) at a quiescent state. Therefore, though the clock output gate 11 (FIG. 2) has received the system clock (DCLK) from the other terminal, the output remains quiescent at H.

The control sequencer 1 (FIG. 2) outputs L (low-level) to the clock output gate 11 (FIG. 2) when receiving a read request from the internal path 7 (FIG. 2). At this moment, the clock output gate 11 (FIG. 2) starts outputting the system clock (DCLK) received from the other terminal. This system clock (DCLK) is transferred to an SDRAM 6 through an output pad 12 (FIG. 2), which is served as the readout clock signal (SCLK(1)). From hereafter, there will be a need to pay attention to the readout clock signal SCLK, since the symbol changes from (SCLK(1)) to (SCLK(2)) each time a delay time is added.

The signal delay path 3 receives the readout clock signal (SCLK) from the start readout operation unit 2, transfers the readout clock signal to the SDRAM 6 with a predetermined delay time, and at the same time, further delays a part of the readout clock signal (SCLK(1)) being transferred to the SDRAM 6, which is transferred to the control sequencer 1 as (SCLK(2)). In other word, the signal delay path 3 delays signals by a predetermined time each time the signals are transferred. This part is not what is configured as a single device using a delay line. It is a summarized conceptual expression of Td1 by which the readout clock signal (SCLK) and so forth are delayed on traveling through the inside of the SDRAM controller 10 (FIG. 2) and the printed wiring board. Here, the delay time on the printed wiring board occurs depending on the layout of the components on the board and other factors.

Therefore, the readout clock signal (SCLK) transferred to the SDRAM 6 (FIG. 2) is delayed by Td1 to be the (SCLK(1)). Further, part of this (SCLK(1)) is diverted and further delayed by Td2 to be the (SCLK(2)), when transferred to the control sequencer 1 (FIG. 2) through the input pad 13 (FIG. 2). Normally, Td1≈Td2.

Similarly, the read data (RD) outputted by the SDRAM 6 (FIG. 2), which is transferred to the temporary read data retention unit 4 through an input/output pad 18 (FIG. 2), follows the similar route, and it is delayed by Td2.

The temporary read data retention unit 4 receives and temporarily retains the read data (RD) transferred from the SDRAM 6 (FIG. 2) through the signal delay path 3 at each cycle of the readout clock signal (SCLK(1)). A read data FF16-1 (FIG. 2), a receiving buffer sequencer 14 (FIG. 2), a receiving buffer 15 (FIG. 2), and a multiplexer 17 (FIG. 2) take on this role.

In other words, the read data (RD) outputted by SDRAM 6 (FIG. 2) at each cycle of readout clock signal (SCLK(1)) is already delayed by Td1 in relation to the start readout signal (SRS) or the DCLK in the same manner as the clock signal (SCLK(1)).

Further, since the read data (RD) is delayed by Td2 before arriving at the receiving buffer 15 (FIG. 2) through the input/output pad 18 (FIG. 2) and the read data FF 16-1(FIG. 2), it is delayed by Td1+Td2 in relation to the start readout signal (SRS) or the DCLK.

On the other hand, since the read data storage enabling signal (MAC) outputted by the control sequencer 1 (FIG. 2) synchronizes with the readout clock signal (SCLK(2)), the read data storage enabling signal (MAC) is delayed by Td1+Td2 in relation to the start readout signal (SRS). As a result, the timing of the read data retained in the receiving buffer 15 (FIG. 2) and the timing of the read data storage enabling signal MAC are the same. Thus, the read data is accurately retained in the receiving buffer 15 (FIG. 2) within the two adjacent readout clock signals (SCLK(2)).

After that, the control sequencer 1 (FIG. 2) sends the read data readout enabling signal (RAC) to the multiplexer 17 (FIG. 2). Then, the read data is taken in by a read data FF 16-2 (FIG. 2) through the multiplexer 17 (FIG. 2) in accordance with the timing of the system clock (DCLK). This read data is outputted to the internal bus 7 through a byte aligner 19 (FIG. 2) and a read data FF 16-3 (FIG. 2), and is transferred to other blocks. Here, the byte aligner 19 (FIG. 2) is a unit that rearranges the alignment of bytes as needed.

Although address/data/control signal generator 41, address/control signal FF 42, write data F/F 43, and output pad 44, etc. are the units related to addressing, the explanation will be omitted since these are not directly related to the explanation of the present invention.

[Operation of the Concrete Example 1]

Figure 3:
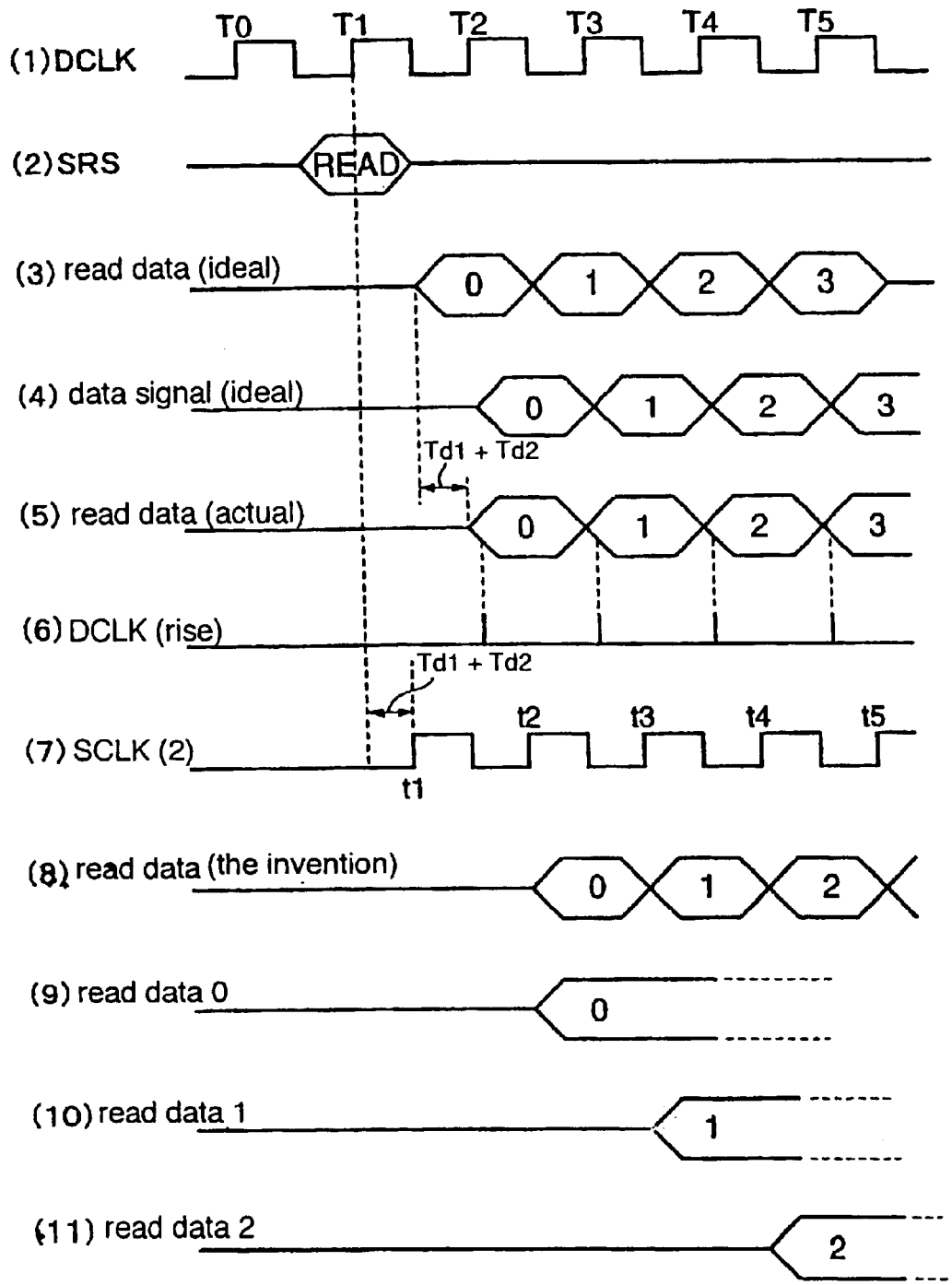
FIG. 3 is a timing chart relating to the invention.

FIG. 3 illustrates a timing chart relating to the invention.

The vertical axis represents in order from the top, (1) system clock (DCLK), (2) start readout signal (SRS), (3) ideal read data, (4) ideal data signal, (5) actual read data, (6) startup timing of system clock DCLK, (7) readout clock signal SCLK (2) delayed by Td1+Td2, (8) read data relating to the invention, (9) read data 0, (10) read data 1, and (11) read data 2. The horizontal axis represents the time.

The SDRAM that received the readout request (SRS) at time T1 outputs the read data (ideal)1 clock after the readout request. The SDRAM controller accepts this output with a flip-flop synchronizing with the system clock DCLK, and supplies it to the internal bus.

It is ideally desirable that the timing of the system clock DCLK and the timing of the readout clock signal (SCLK(1)) (FIG. 2) for reading data from the SDRAM coincide completely. As long as this condition is satisfied, timings T2, T3, T4, and T5 of the flip-flop are positioned at the determined area (the antinodal area on the chart) of the read data. Therefore, the data signals (4) will completely be determined.

In reality, however, the read data (RD) (FIG. 2) that the SDRAM 6 (FIG. 2) takes in and outputs in accordance with each cycle of the readout clock signal (SCLK(1)) (FIG. 2) is already delayed by Td1 in relation to the start readout signal (SRS) (FIG. 2) or the DCLK (FIG. 2) in the same manner as the readout clock signal (SCLK(1)) (FIG. 2).

Further, the read data (RD) (FIG. 2) is delayed by Td2 before it arrives at the receiving buffer 15 (FIG. 2) through the input/output pad 18 (FIG. 2) and the read data FF 16-1. Therefore, the read data (actual) (5) is delayed by Td1+Td2 in relation to the read data (ideal) (3).

As a result, the startup timing of the system clock ((6) DCLK (rise)) is not necessarily positioned at the data determined area (the antinodal area on the chart), and could occur to be positioned at an undetermined area (the varying area on the chart). The ratio of the undetermined area (the varying area on the chart) to the determined area (the antinodal area on the chart) increases as the system clock frequency becomes higher.

In the invention, the control sequencer 1 (FIG. 2) generates the SCLK (2) (FIG. 2) that is delayed by Td1+Td2 in relation to the system clock (DCLK). By synchronizing the timing with this SCLK (2) (FIG. 2), the read data FF 16-1

(FIG. 2) accepts the read data (actual). Therefore, the timing t2, t3, t4, and t5 of the flip-flop accepting the read data (actual) are positioned at the data determined area (the antinodal area on the chart). As a result, the read data (actual) is accepted by read data FF 16-1 (FIG. 2) in a completely determined state.

The read data (the invention) (8) is decomposed into bit data and temporarily retained in the receiving buffer 15 (FIG. 2). The state is illustrated in read data 0 (9), read data 1 (10), and read data 2 (11). This state is equivalent to a longer data determined area (antinodal area on the chart). The read data FF 16-2 (FIG. 2) receives each bit data through the multiplexer 17 (FIG. 2). Since the data determined area is substantially extended at this moment, the data will not become undetermined even though the clock conversion form the SCLK (2) (7) into the DCLK (1) is effected.

[Concrete Example 2]

Figure 4:
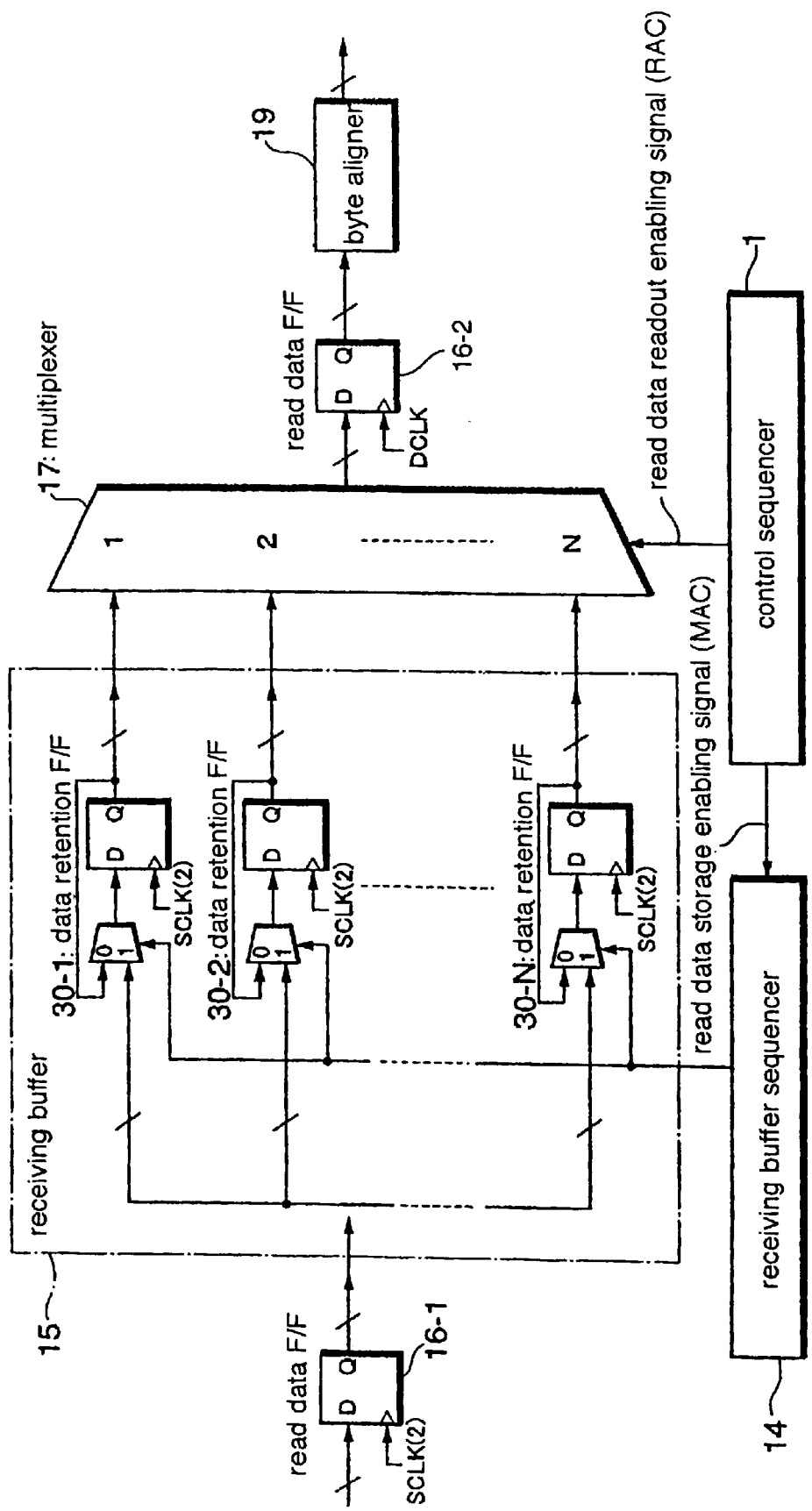
FIG. 4 is a circuit diagram of the read data temporary retention unit.

In the concrete example 2, one embodiment of the temporary read data retention unit explained in the concrete example 1 will be described in detail. FIG. 4 illustrates the circuit diagram of the temporary read data retention unit.

In FIG. 4, the temporary read data retention unit is provided with the receiving buffer sequencer 14, the receiving buffer 15 that includes plural data retention F/Fs 30-1~30-N, the read data FF 16-1, and the multiplexer 17.

The receiving buffer sequencer 14 receives the read data readout enabling signal (RAC) from the control sequencer 1, selects a predetermined memory unit from the plural data retention F/Fs (memory units) including data retention F/Fs 31-1~30-N, and stores the bit data. In other words, the receiving buffer sequencer 14 is a unit that stores the read data transferred to the read data FF 16-1 to be synchronized with the readout clock signal (SCLK(2)) into the plural data retention F/Fs 30-1~30-N per bit in order. The receiving buffer sequencer 14 contains therein a circuit with a combination of a counter and a decoder for example. A ring counter circuit can also be used for it.

The receiving buffer 15 is a memory unit that receives the read data storage enabling signal (MAC) from the control sequencer 1 through the receiving buffer sequencer 14 and temporarily stores the read data. The plural data retention F/Fs 30-1~30-N takes on this role.

The read data FF 16-1 is a unit that receives the read data transferred from the SDRAM 6 (FIG. 2) to be synchronized with the timing of the readout clock signal (SCLK (2)). Usually, a flip-flop is employed.

The multiplexer 17 selects and outputs a predetermined bit data from the plural data retention F/Fs 30-1~30-N based on the read data readout enabling signal (RAC) sent by the control sequencer 1. In other words, the multiplexer 17 selects one of the plural data retention F/Fs 30-1~30-N based on the read data readout enabling signal (RAC) and outputs the bit data thereof.

[Operation of the Concrete Example 2]

The operation of the temporary read data retention unit according to the configuration described above will be explained with FIG. 3 once again.

The SCLK (2) and the read data (actual) are both delayed by Td1+Td2 in relation to the DCLK. Therefore, the read data F/F 16-1 is able to receive the read data in a completely determined state. This state is represented by the (8) read data (the invention).

As having received the read data storage enabling signal (MAC) from control sequencer 1, the receiving buffer sequencer 14 stores the read data being consecutively transferred at the timing of SCLK (2) into the data retention F/Fs 30-1~30-N in a sequential order. The state in which the read data is stored is represented by the read data 0, read data 1, read data 2.

As having received the read data readout enabling signal (RAC) from control sequencer 1, the multiplexer 17 takes in the bit data stored in the data retention F/Fs 30-1~30-N in a sequential order. This read data readout enabling signal (RAC) synchronizes with the DCLK.

As a result, the clock signal that controls the read data (actual) (5) is converted from the SCLK (2) into the DCLK. The read data in which the clock conversion from the SCLK (2) to the DCLK has been effected is transferred to the internal bus 7 (FIG. 2) through the read data F/F 16-2 and the byte aligner 19.

As described above, a read data taken in from the SDRAM in accordance with each cycle of the readout clock signal SCLK (2), which is delayed by a predetermined time in the signal delay path, is temporarily stored in the temporary read data retention unit in accordance with a timing of the readout clock signal traveling through the same path, having a delay of the same period of time. In this manner, the read data has been retained accurately before the control sequencer sends the read data readout enabling signal synchronized with the system clock (DCLK), which makes it possible to prevent indeterminacy of the read data taken in at each cycle of the readout clock signal. As a result, it becomes unnecessary to take measures such as sophisticating the inner layout of an LSI so as to shorten the delay time, and lowering the frequency of the DCLK in order to increase the cycle of the clock signal, etc.

What is claimed is:

1. A synchronous DRAM controller comprising:

a control sequencer that outputs a start readout signal to synchronize with a system clock signal, when receiving a read request to an SDRAM (Synchronous Dynamic Random Access Memory) from an internal bus, a start readout operation unit that starts transferring a readout clock signal to the SDRAM, when receiving the start readout signal from the control sequencer, a signal delay path that receives the readout clock signal from the start readout operation unit, delays the signal to transfer it to the SDRAM, and further delays a part of the readout clock signal to transfer it to the control sequencer, and a temporary read data retention unit that receives and temporarily retains a read data taken in and outputted by the SDRAM at each cycle of the readout clock signal through the signal delay path, wherein, when receiving a part of the readout clock signal from the signal delay path, the control sequencer sends a read data storage enabling signal to the temporary read data retention unit, makes the read data retention unit temporarily retain the read data taken in to be synchronized with the readout clock signal, and outputs a read data readout enabling signal in order to output the read data to synchronize with the system clock signal.

2. A synchronous DRAM controller as claimed in claim 1, wherein the temporary read data retention unit includes:

plural memory units that receive the read data storage enabling signal and store the read data by each bit data, a bit data storage location selection unit that receives the read data storage enabling signal from the control sequencer, selects a predetermined memory unit from the plural memory units, and stores the bit data, and a bit data selection/output unit that selects a predetermined memory unit from the plural memory units on the basis of the read data readout enabling signal, and outputs the bit data stored in the memory unit.

3. A synchronous DRAM controller as claimed in claim 2, wherein:
the plural memory units include plural flip-flop circuits arranged in parallel,
the bit data storage location selection unit includes a circuit made up with a combination of a counter and a decoder, and
the bit data selection/output unit includes a multiplexer circuit.

4. A synchronous DRAM controller as claimed in claim 3, wherein the bit data storage location selection unit includes a ring counter circuit.

* * * * *